United States Patent
Visokay et al.

[11] Patent Number: 5,603,766
[45] Date of Patent: Feb. 18, 1997

[54] METHOD FOR PRODUCING UNIAXIAL TETRAGONAL THIN FILMS OF TERNARY INTERMETALLIC COMPOUNDS

[75] Inventors: Mark R. Visokay, Stanford, Calif.; Bruce M. Lairson, Houston, Tex.; Robert Sinclair, Palo Alto, Calif.

[73] Assignee: Board of Trustees of the Stanford Leland Junior University, Stanford, Calif.

[21] Appl. No.: 393,560

[22] Filed: Feb. 23, 1995

[51] Int. Cl.$^6$ .................................................. C30B 29/10
[52] U.S. Cl. ........................... 117/105; 117/108; 117/109; 117/939
[58] Field of Search ........................ 117/108, 109, 117/105, 939

[56] References Cited

U.S. PATENT DOCUMENTS

| | | | |
|---|---|---|---|
| 5,147,732 | 9/1992 | Shiroishi et al. | 428/668 |
| 5,149,409 | 9/1992 | Ahlert et al. | 204/192.2 |
| 5,316,844 | 5/1994 | Suzuki et al. | 428/323 |
| 5,389,398 | 2/1995 | Suzuki et al. | 427/130 |

OTHER PUBLICATIONS

A. Cebollada, D. Weller, J. Sticht, G. R. Harp, R. F. C. Farrow, R. F. Marks, R. Savoy and J. C. Scott, "Enhanced Magneto–Optical Kerr Effect in Spontaneously Ordered FePt Alloys: Quantitative Agreement Between Theory and Experiment", Physical Review B vol. 50, No. 5 p. 3419 (1994).

M. R. Visokay and R. Sinclair, "Direct Formation of Ordered CoPt and FePt Compound Thin Films by Sputtering", Applied Physics Letters No. 66 (13) p. 1692 (1995).

M. R. Visokay and R. Sinclair, "Growth and Characterization of FePt Compound Thin Films", Materials Research Society Symposium Proceedings in press (1995).

G. T. Stevens, M. Hatherly and J. S. Bowles, "The Ordered Phase Fields of the Iron–Nickel–Platinum Equilibrium Diagram", Journal of Materials Science No. 13 p. 499 (1978).

J. C. Woolley and B. Bates, "Ordering in CoPt–FePt Alloys", Journal of the Less Common Metals, vol. 1, p. 382 (1959).

J. C. Woolley and B. Bates, "Ordering in CoPt–NiPt Alloys", Journal of the Less Common Metals, vol. 2, p. 11 (1960).

D. C. Martin, "Crystallographic and Magnetic Properties of Pseudobinary Alloys Based on Cobalt–Platinum", Journal of Physics F, vol. 5, p. 1031 (1975).

*Primary Examiner*—Robert Kunemund
*Attorney, Agent, or Firm*—Lumen Intellectual Property Services

[57] ABSTRACT

A method for making oriented thin films of a ternary intermetallic compound and such films having a tetragonal structure and generally uniaxial magnetic, optical, electronic, and mechanical properties, as well as a generally lower Curie temperature than oriented binary intermetallic films. The steps of the method involve selecting a substrate material for biasing the orientation of the ternary intermetallic compound and exhibiting no chemical reactiveness to the ternary intermetallic compound. Preferably, such substrate is a single crystal, such as MgO or $Al_2O_3$, or an amorphous material such as pure $SiO_2$, amorphous carbon, or glass. In a second step the substrate is heated to a temperature above 450° C. and then, a first metal, a second metal, and a third metal are simultaneously deposited on the substrate material. The first metal and second metal are selected from among metals pairs including CoNi, CoFe, FeNi, and the third metal is selected from the group of metals consisting of Pd and Pt. The thin film formed is a ternary intermetallic compound exhibiting an $L1_0$ crystal structure and the desired uniaxial properties. The method of the invention allows one to accurately control the relative amounts of the three metals.

25 Claims, 8 Drawing Sheets

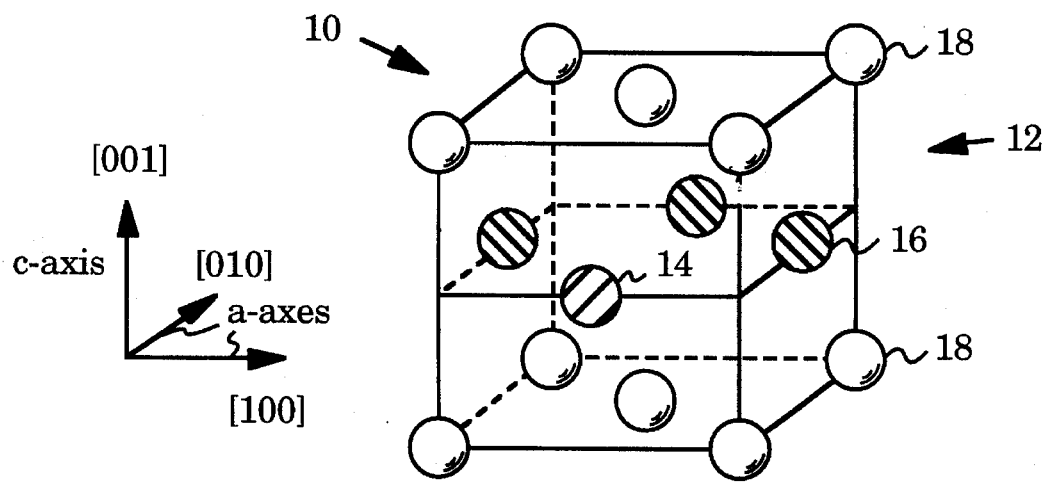
FIG. 1
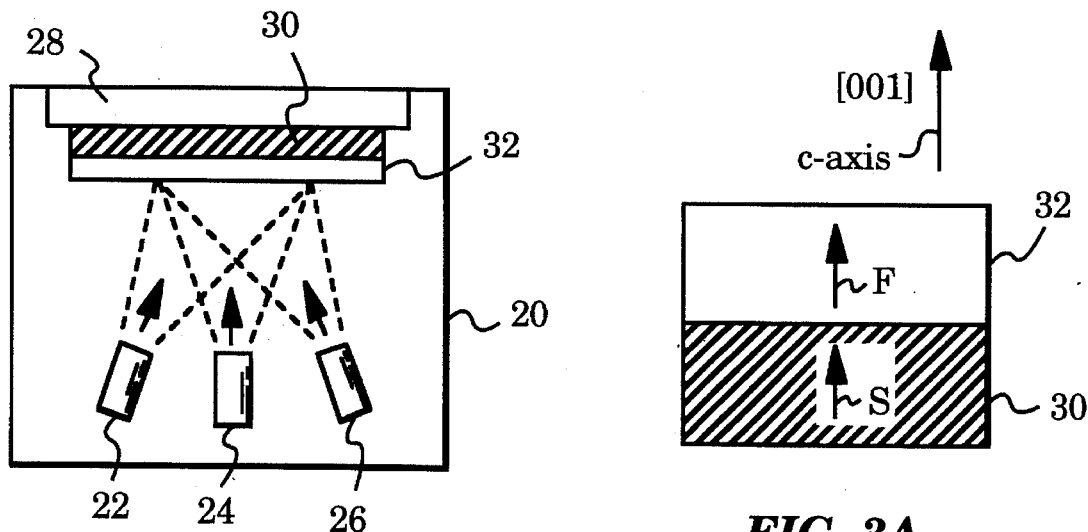
FIG. 2
FIG. 3A
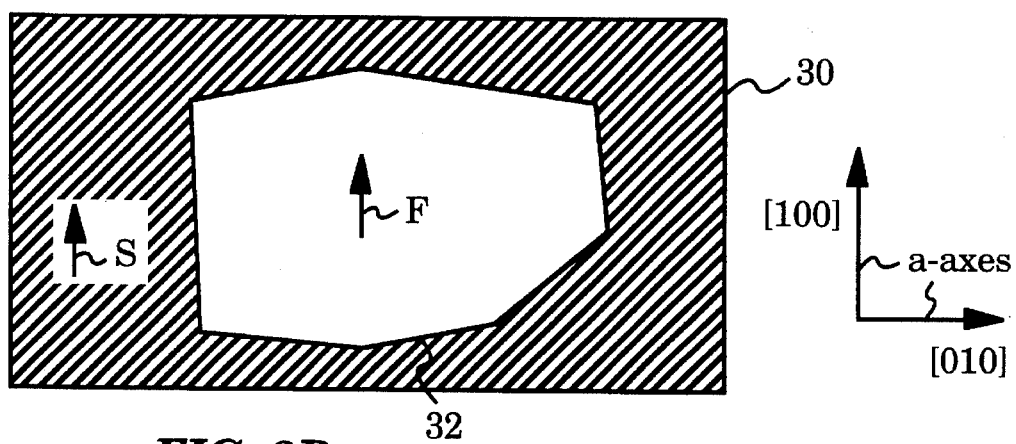
FIG. 3B

METHOD FOR PRODUCING UNIAXIAL TETRAGONAL THIN FILMS OF TERNARY INTERMETALLIC COMPOUNDS

BACKGROUND—FIELD OF THE INVENTION

The present invention relates to the field of oriented thin film structures, and in particular to uniaxial thin film structures of ternary intermetallic compounds exhibiting uniaxial magnetic, electronic, optical, and mechanical properties.

BACKGROUND—DESCRIPTION OF PRIOR ART

It is well known in materials science that uniaxial structures typically have pronounced uniaxial physical properties as a result of their orientation. For example, those bulk phase intermetallic compounds which can be grown as single crystals in a tetragonal $L1_0$ crystal structure have magnetic, electrical, optical, and mechanical properties which are axially symmetric about the [001] crystal direction, along the c-axis of the crystal.

The highly directional physical properties of uniaxial structures are particularly desirable in the design of magneto-optic memory devices. These are typically planar, disc-shaped devices having a thin film coating of opto-magnetic material which can be magnetically modified at selected locations to store data. It is very desirable for the magnetic moment vector of such an opto-magnectic material to be aligned perpendicular to the plane of the film and parallel to the direction of incidence of the light. Due to physical principles this orientation results in optimal coupling between the photons of incident light and the corresponding crystals of the opto-magnetic material. Consequently, materials having strong uniaxial magnetic moments aligned perpendicular to the plane of the device allow the storage of data at higher densities and in more advantageous recording geometries. A major impediment to the realization of such high density storage devices is the difficulty of producing the uniaxial properties of bulk crystals in thin film structures. Uniaxial $L1_0$ crystals such as tetragonal CoPt have been produced in bulk materials by strain annealing and by directional solidification of the component elements. However, neither of these methods is applicable to thin films due to the mechanical constraints imposed by the substrate. Attempts to produce oriented uniaxial structures in thin films have relied instead on various deposition techniques to either directly grow thin films of aligned uniaxial crystals or to assemble artificial superlattices by sequential layering the constituent materials.

Oriented intermetallic thin films have been produced by means of texturing, wherein the components of a bulk uniaxial material are deposited on amorphous or polycrystalline substrates, and have some degree of alignment. In the case of tetragonal PtFe and CoPt, this method has produced thin films with out of plane alignments in the >111< directions and no alignment in the desired [001] direction.

Two of the applicants have previously disclosed a method for producing uniaxial thin film structures formed from oriented bi-layers and multi-layers in U.S. Pat. No. 5,363,794 issued Nov. 15, 1994. These $L1_0$ crystals of binary intermetallic compounds, such as tetragonal PtFe, PtCo, FeNi, FePd, NiPd, NiPt, or CoNi are formed by first assembling artificial superlattices through sputter deposition of alternating layers of the component metals. Single crystal substrates or crystallographically textured substrates are used to induce proper alignment of the deposited layers. The thin film is produced in a final annealing step. This method is successful in producing uniaxially oriented binary intermetallic compounds. Unfortunately, the physical parameters, most notably the Curie temperature, of most binary films is still too high to be of use for magneto-optic recording media.

OBJECTS AND ADVANTAGES OF THE INVENTION

In view of the above, it is an object of the present invention to produce thin layers of intermetallic compounds exhibiting improved properties with respect to thin films of binary intermetallic compounds. The invention envisions production of uniaxial thin film structures of ternary intermetallic compounds exhibiting superior uniaxial magnetic, electronic, optical, and mechanical properties. Such uniaxial thin films will exhibit, among other things, a lower Curie temperature.

It is another object of the invention to devise a method to allow the production of such thin films by simple means and at low cost.

These and other objects and advantages will become more apparent after consideration of the ensuing description and the accompanying drawings.

SUMMARY OF THE INVENTION

The method of the invention achieves the objectives by making oriented thin films of a ternary intermetallic compound having a tetragonal structure and generally uniaxial magnetic, optical, electronic, and mechanical properties. The steps of the method involve selecting a substrate material having an alignment suitable for biasing the orientation of the ternary intermetallic compound and exhibiting no chemical reactiveness to the ternary intermetallic compound. Preferably the substrate material is a single crystal, such as MgO or $Al_2O_3$, or an amorphous material such as pure $SiO_2$, amorphous carbon, or glass.

In a second step the substrate material is heated to a temperature above 450° C. and then, in a third step, a first metal, a second metal, and a third metal are simultaneously deposited on the substrate material to directly produce the thin film. Preferably, the deposition process is performed by co-sputtering or molecular beam epitaxy. The first metal and second metal are selected from among metal pairs including CoNi, CoFe, FeNi, and the third metal is selected from the group of metals consisting of Pd and Pt. The thin film formed is a ternary intermetallic compound exhibiting an $L1_0$ crystal structure and uniaxial properties. The crystal is aligned along the c-axis.

The relative amounts of the three metals are accurately controlled. In particular, the amount of the third metal (Pt, Pd) with respect to the pair of metals is kept between 40 at. % and 60 at. %, or, most preferably at 50 at. %. The relative amount of the first metal and the second metal is preferably determined in at. % according to the formulas $Co_xNi_{50-x}$ for $0<x\leq30$, $Fe_xNi_{50-x}$ for $0<x\leq30$, and $Fe_xCo_{50-x}$ for $0<x\leq50$.

To further ensure proper alignment the parameters of the substrate material are adapted to conform to the base plane of the crystal cells of the ternary compound. This is done by determining the crystal parameters of single crystal substrates and general parameters of amorphous substrates. Additional pre-seed and seed layers can also be provided to further improve the growth of uniaxial thin films according to the invention.

A detailed description of the method according to the invention is set forth below in reference to the enclosed drawing figures.

BRIEF DESCRIPTION OF THE DRAWINGS

FIG. 1 is a perspective view of the crystal structure of a ternary intermetallic compound of which a thin film according to the invention is made.

FIG. 2 is a schematic representation of a sputtering arrangement for practicing the method of the invention.

FIG. 3A is a cross-sectional view of an interface between a single crystal substrate and a thin film deposited according to the invention.

FIG. 3B is a plan view of the thin film and substrate of FIG. 3A.

DESCRIPTION

Figure 4A:
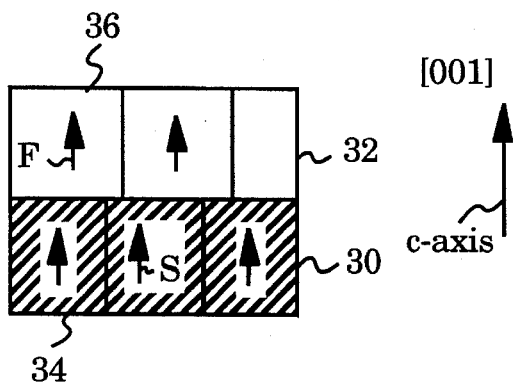
FIG. 4A is a cross-sectional view of an interface between a textured substrate and a thin film.

Before discussing the method for producing uniaxial thin films according to the invention, it is helpful to review the crystal structure of ternary intermetallic compounds used in making such films. FIG. 1 shows a crystal 10 of a ternary intermetallic compound 12 in a perspective view. In the representation shown here, crystal 10 has a face-centered tetragonal structure. Alternative, equivalent representations of this crystal structure exist but are not shown here. This particular representation is chosen for simplicity. It consists of atoms of a first metal 14, a second metal 16, and a third metal 18. First metal 14 and second metal 16 sit in the plane sandwiched between the atoms of third metal 18. The three-dimensional structure of crystal 10 is described by the coordinate system identifying the [100], [010], and [001] crystal directions. Directions [100] and [010] define the a-axes or the base plane of crystal 10, while direction [001] identifies the c-axis, which is perpendicular to the base plane.

Metals 14 and 16 belong to the following metal pairs respectively: CoNi, CoFe, FeNi. Third metal 18 is Pt or Pd. In a preferred embodiment the relative amount of third metal 18 expressed in terms of atomic weight lies between 40 and 60 at. %. In fact, in the most preferred version the amount of third metal 18 is 50 at. %. The relative amounts of first metal 14 and second metal 16 are described by the following formulas: $Co_xNi_{50-x}$, $Fe_xNi_{50-x}$, and $Fe_xCo_{50-x}$ where $0<x\leq50$. Most preferably, the relative amounts for the first two pairs $Co_xNi_{50-x}$, $Fe_xNi_{50-x}$ are in the range $0<x\leq30$. Meanwhile, the amount of third metal 18 is determined according to the formulas $(CoNi)_{100-m}Pt_m$, $(FeNi)_{100-m}Pt_m$, $(FeCo)_{100-m}Pt_m$, $(CoNi)_{100-m}Pd_m$, $(FeNi)_{100-m}Pd_m$, $(FeCO)_{100-m}Pd_m$. In the most preferred case the amount of third metal 18 is 50 at. % and thus m equals 50.

Within the above-specified ranges ternary intermetallic compound 12 retains the face-centered tetragonal crystal structure shown in FIG. 1. This structure is commonly referred to as $L1_0$ and exhibits many advantageous properties. In particular, the magnetic, optical, electronic, and mechanical properties of crystal 10 are generally aligned with the c-axis.

The method for producing thin films of ternary intermetallic compound 12 is best explained with reference to FIG. 2. The schematic representation of FIG. 2 shows a conventional sputtering chamber 20 equipped with three DC magnetron sputtering sources 22, 24, and 26. Sources 22, 24, and 26 are pointed at a target 28 holding a substrate material 30. Each source 22, 24, 26 is designed to release atoms of first metal 14, second metal 16, and third metal 18 respectively, when hit with an ionized atom of a noble gas. For economic reasons Argon (Ar) is the preferred noble gas.

Substrate 30 is preferably a single crystal whose lattice parameter is approximately equal to or slightly larger than the a-axis of crystal 10. Preferably, the mismatch between the lattice parameter of substrate 30 and the a-axis of crystal 10 is no larger than 0.4 Angstroms. The lattice parameter of substrate 30 can also be equal to an integer multiple of the a-axis of crystal 10 or to $\sqrt{2}$ times that a-axis.

These set ratios between the lattice parameter of substrate 30 and the a-axis of the ternary intermetallic compound ensure that compound 12 grown on substrate 30 from metals 14, 16, 18 will assume the form of crystal 10 in alignment with the c-axis. In addition, the material of substrate 30 is not reactive with any of the three metals 1t, 16, or 18, separate or in combination. Suitable substrate materials 30 include MgO, $Al_2O_3$, and similar materials well-known to persons skilled in the art. Preferably, MgO used as substrate 30 has either a [001] or [110] crystal orientation. The crystal orientation of $Al_2O_3$ is preferably [0001]. Substrate 30 can also be an amorphous material. For example, pure $SiO_2$, amorphous carbon, or glass can be utilized. A person skilled in the art will know how to select appropriate substrate materials 30.

A thin film 32 of tetragonal intermetallic material 12 is deposited on substrate 30 by co-sputtering of metals 1t, and 18 inside chamber 20 at an elevated temperature. In the preferred embodiment this temperature is at least 450° C. In the preferred embodiment the sputtering is performed with Ar atoms used to simultaneously knock out atoms of metals 16, and 18 at sources 22, 24, 26. Furthermore, the Ar pressure inside sputtering chamber 20 is best maintained between 3 and 10 mTorr. Due to kinetic energy imparted to them by the ionized Ar atoms the source atoms released by the collision are propelled towards target 28 and impact on substrate The lattice structure matching of substrate 30 to the a-axis of crystal 10 (see above) causes metals 22, 24, and 26 to form compound 12 directly on substrate 30. The c-axis of crystals 10 thus produced is properly aligned as shown in FIG. 3A. In particular, FIG. 3A shows a cross-sectional view of the interface between a single crystal substrate 30 and thin film 32. Arrows F and S indicate the orientation of film 32 and substrate 30 respectively. Using the same arrows FIG. 3B illustrates the alignment of film 32 and substrate 30 in the plane described by the a-axes. In both cases the alignment of the crystal comprising film 32 matches the orientation of substrate 30.

Figure 4B:
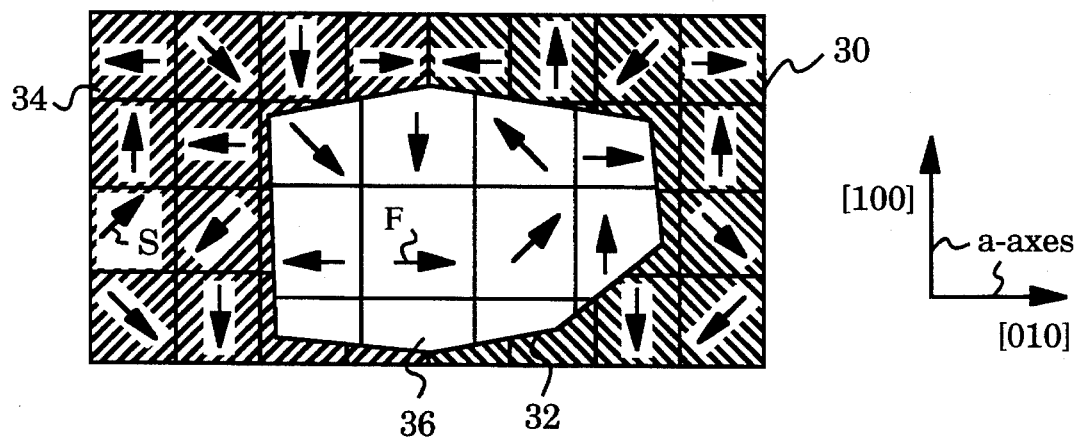
FIG. 4B is a plan view of the interface of FIG. 4A.

FIGS. 4A and 4B show the effects of using a textured substrate 30. Such substrate 30 consists of substrate crystal cells 34. Along the c-axis (FIG. 4A) the orientation of film crystal cells 36 is parallel to the orientation of substrate crystal cells 34. In the a-plane (FIG. 4B) the orientations of cells 34 and 36 is random.

Figure 5A:
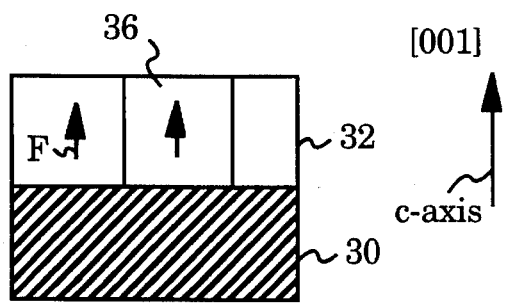
FIG. 5A is a cross-sectional view of an interface between an amorphous substrate and a thin film.
Figure 5B:
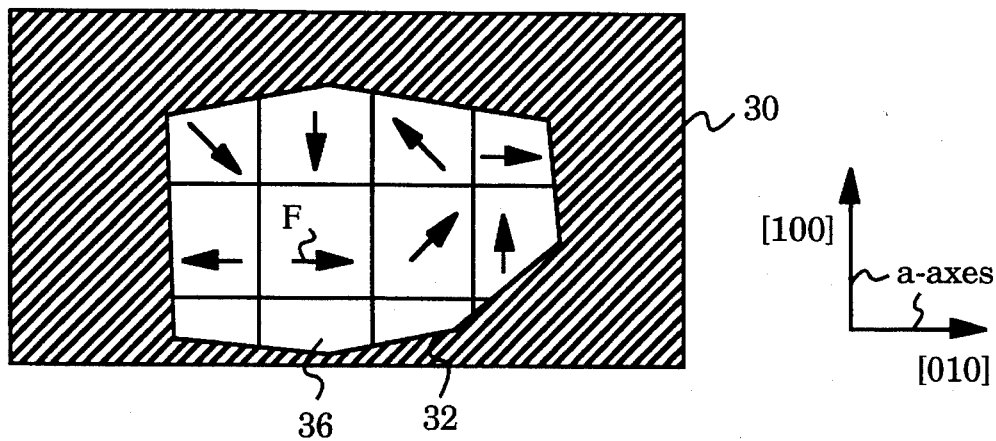
FIG. 5B is a plan view of the interface of FIG. 5A.
Figure 6:
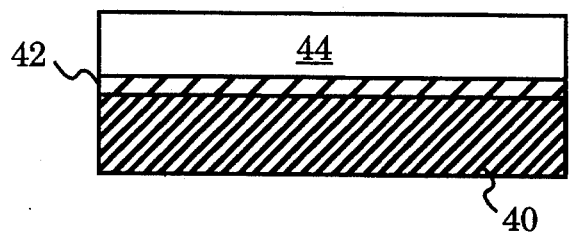
FIG. 6 is a detailed side view of a preferred substrate for depositing a thin film of a ternary intermetallic compound.
Figure 7:
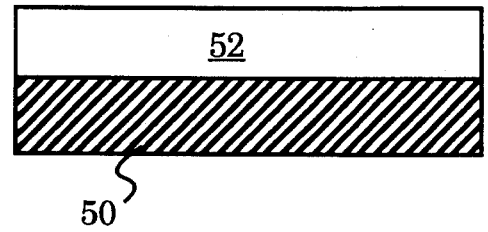
FIG. 7 is a detailed side view of another substrate composition.

FIGS. 5A and 5B illustrate the third case in which film 32 is deposited on an amorphous substrate 30, e.g., glass. Such substrate contains no crystal cells. The resulting film 32 presents crystal cells 36 which are aligned with the c-axis but randomly orientated in the a-plane.

Thanks to the c-axis alignment of film cells 36 thin film 32 of ternary intermetallic compound 12 has generally uniaxial magnetic, optical, electronic, and mechanical properties. Film 32 has a tetragonal structure $L1_0$. This renders it very useful in the production of opto-magnetic data storage media and other devices relying on such uniaxial thin films. Film 32 is more responsive to photons used in optical recording than binary tetragonal compounds previously described by some of the applicants in U.S. Pat. No. 5,363,794. Furthermore, since sputtering is a well-known, widely accepted, and relatively simple technique the method of producing ternary intermetallic compound 12 is straightforward and low-cost. Finally, by modifying the relative amounts of metals 14, 16, 18 one can produce compounds 12 with very well-defined properties.

In another embodiment of the invention a modified substrate 40, as shown in FIG. 4, is used in the sputtering process. Substrate 40 is coated with a pre-seed layer 42 and a seed layer 44. Any conventional coating process including, but not limited to, sputtering or molecular beam epitaxy may be used to deposit layers 42 and 44. For best results the thickness of pre-seed layer 42 is approximately 5 Angstroms while the thickness seed layer 44 is approximately 50 Angstroms. Preferably, the material of layer 42 is Fe and the material of layer 44 is selected from the group of materials consisting of Fe, Pt, Pd, Cr.

During the deposition process substrate 40 provided with layers 42 and 44 presents a better lattice match and crystalline alignment for subsequent deposition.

In yet another advantageous embodiment a substrate 50 is coated with only a seed layer 52. Again, seed layer 52 is preferably 50 Angstroms thick and its material is selected from the group consisting of Fe, Pt, Pd, Cr. Substrate 50 also has highly desirable physical parameters for growing thin films according to the invention.

Experimental Results

Figure 8:
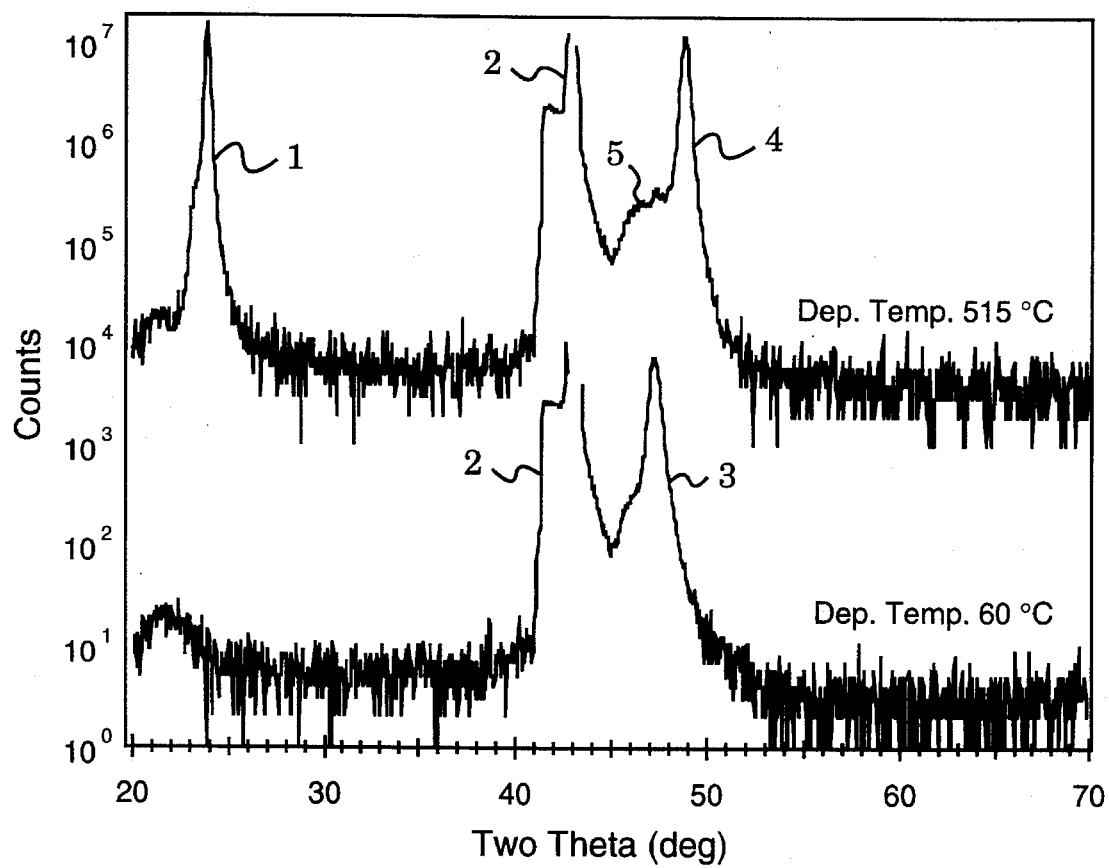
FIG. 8 shows an X-ray diffraction diagram for a binary film deposited at different deposition temperatures.

The advantageous properties of thin films produced according to the invention are best demonstrated with the aid of experimental data. For comparison purposes, FIG. 8 shows an X-ray diffraction diagram for a binary film, $Fe_{50}Pt_{50}$, deposited at two different deposition temperatures. Moving from the left, peak 1 in the top graph corresponding to a deposition temperature of 515° C. is due to the desired [001] ordering of the film. This peak is completely absent in the lower graph, which illustrates the X-ray diffraction pattern for a film deposited at 60° C. On this basis, a high deposition temperature is needed to produce the ordered [001] phase. This is true for binary films of prior art and ternary films of the invention.

Peak 2 corresponds to the (002) planes of the MgO substrate, and peak 3 is the (002) peak from the disordered FePt alloy. This means that the Fe and Pt atoms are randomly distributed throughout the structure, rather than occupying specific locations. Peak 4 represents the ordered (002) FePt phase, and, finally, peak 5 is due to diffracted intensity from a Pt seed layer used on the MgO substrate.

Figure 9:
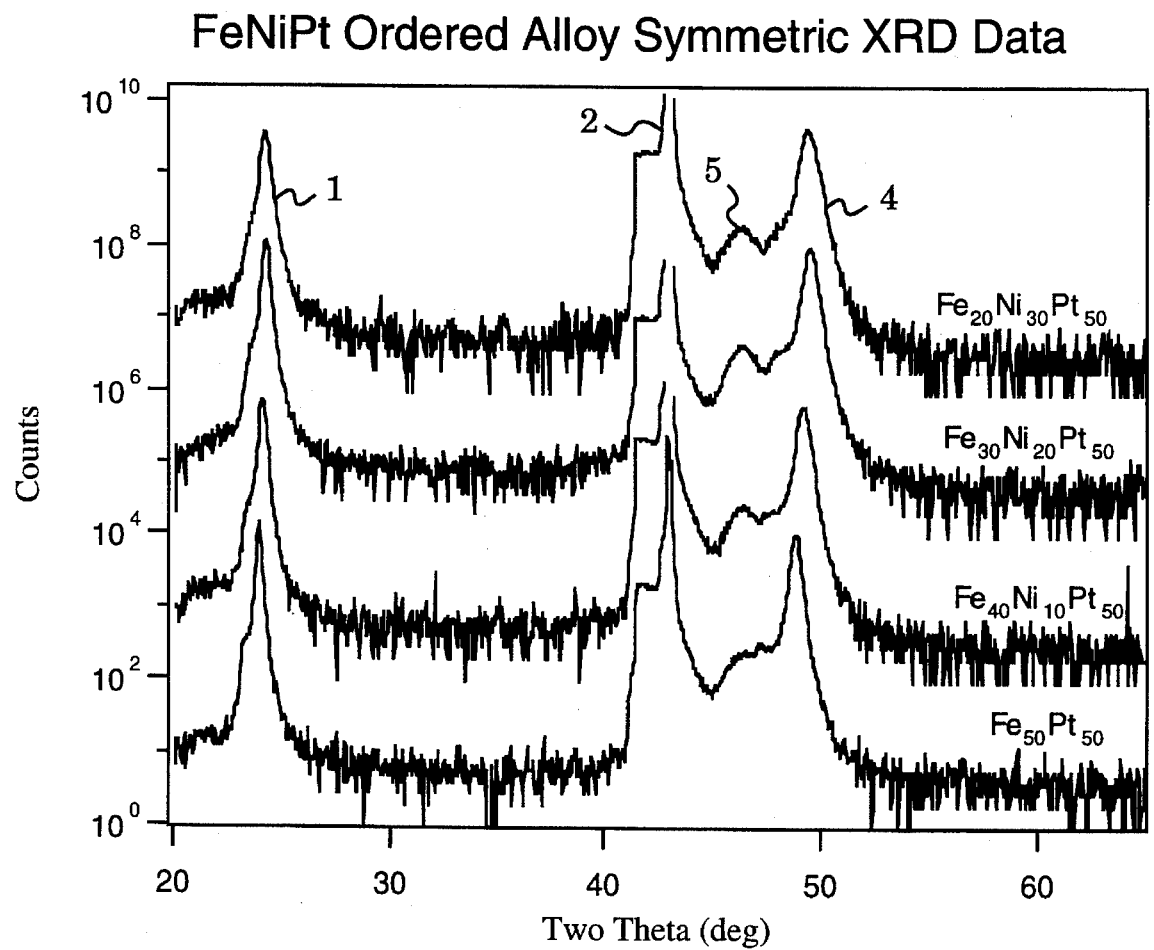
FIG. 9 illustrates an X-ray diffraction graph for various FeNiPt alloys according to the invention and a binary $Fe_{50}Pt_{50}$ alloy.

FIG. 9 illustrates an X-ray diffraction graph for various FeNiPt alloys and the binary $Fe_{50}Pt_{50}$ alloy. In all cases peak 1 attests to the presence of ordered [001] phase. The other peaks (2, 4, 5) are also highly visible. The c-axis lattice parameter can be measured using these data. For the $Fe_{20}Ni_{30}Pt_{50}$ alloy the c-axis lattice parameter is 3.68 Angstroms. Similar peaks can be found in other ternary uniaxial intermetallic compounds according to the invention.

Figure 10:
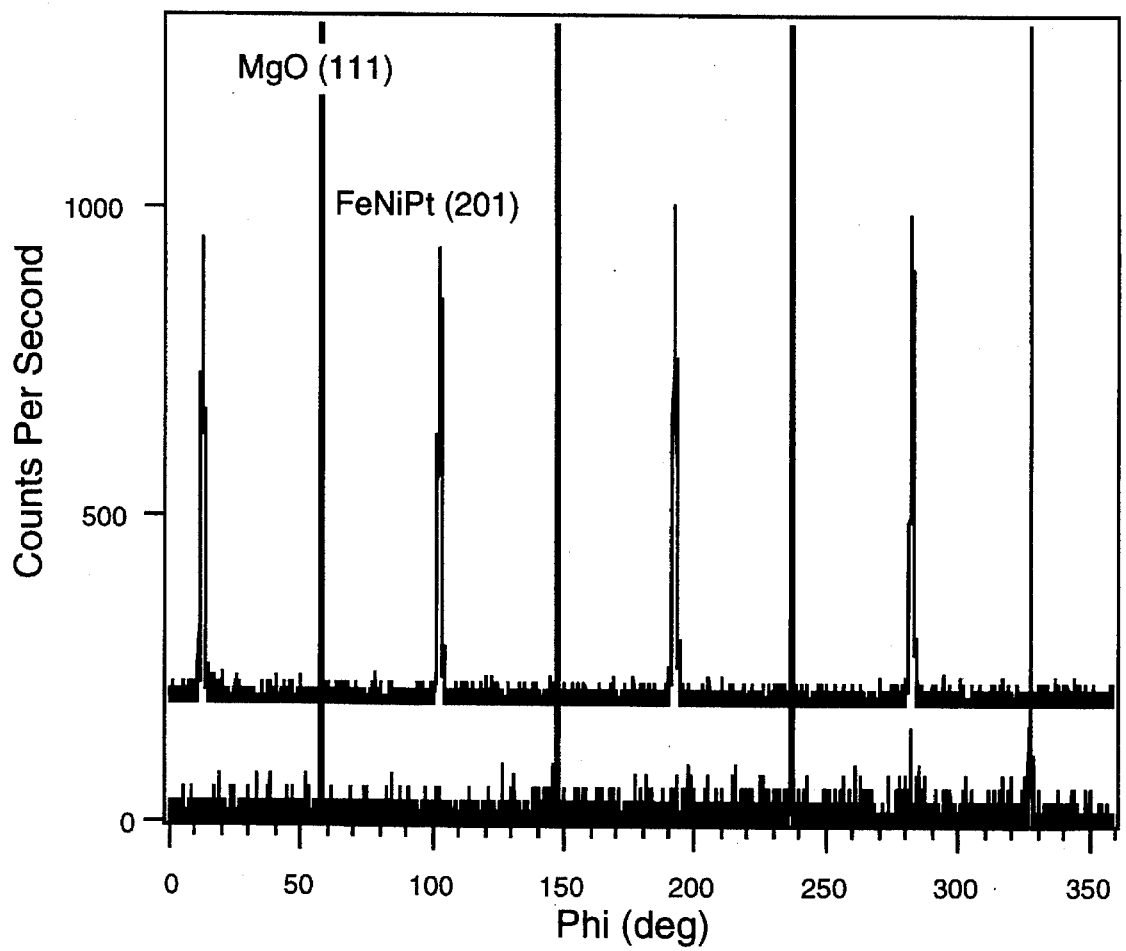
FIG. 10 is a graph demonstrating the a-plane orientation of the films according to the invention.

FIG. 10 establishes the a-plane orientation of the films according to the invention. Specifically, the graph shows an $Fe_{20}Ni_{30}Pt_{50}$ alloy on an MgO substrate along planes inclined to the surface normal. The peaks correspond to the {111} planes of the MgO substrate and the (201), (021), ($\bar{2}01$), ($0\bar{2}1$) planes of the $Fe_{20}Ni_{30}Pt_{50}$ alloy. The angle phi describes rotation about the film surface normal. Together, the graphs clearly indicate the expected 4-fold symmetry of the substrate and the film and the 45° difference between their corresponding peaks.

Figure 11:
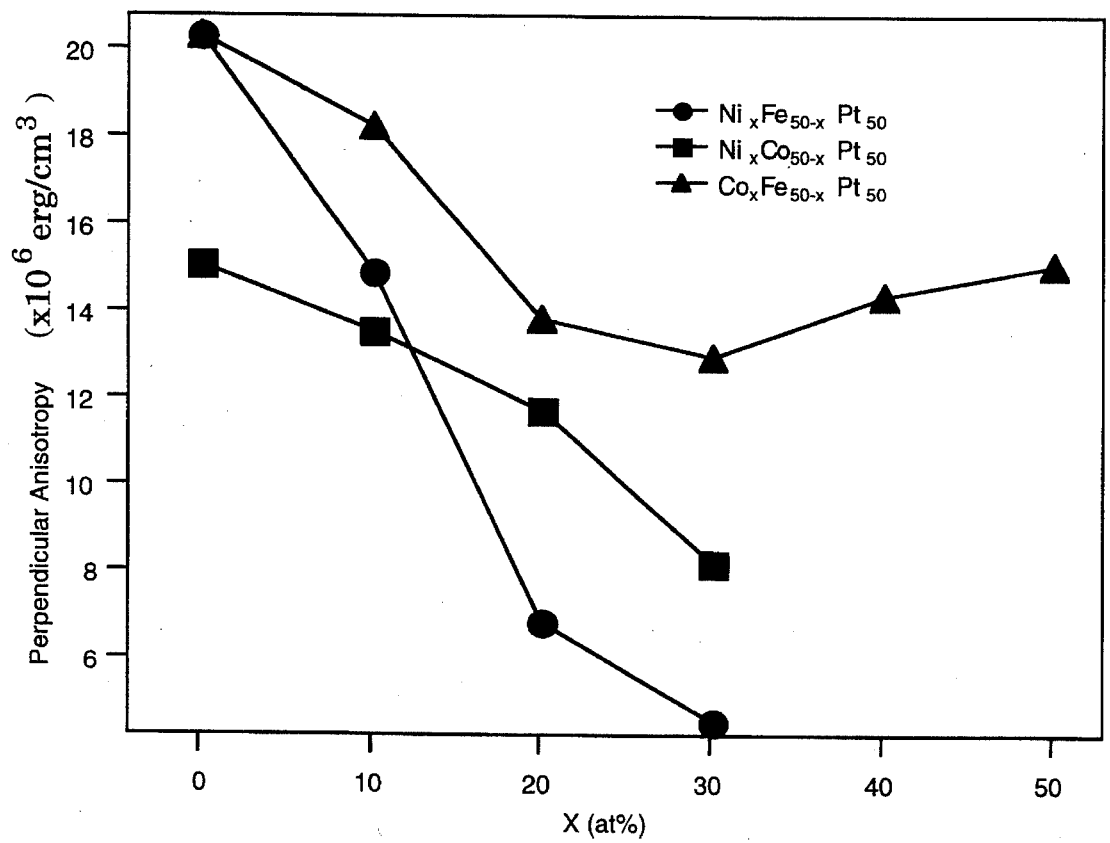
FIG. 11 is a graph of the perpendicular magnetic anisotropy energy for alloy systems according to the invention.

The perpendicular magnetic anisotropy energy for three films, $Ni_xFe_{50-x}Pt_{50}$, $Ni_xCo_{50-x}Pt_{50}$, and $Co_xFe_{50-x}Pt_{50}$ is illustrated in FIG. 11. The values are large and positive indicating the preference of magnetic moments to align out of the film plane as desired.

Figure 12:
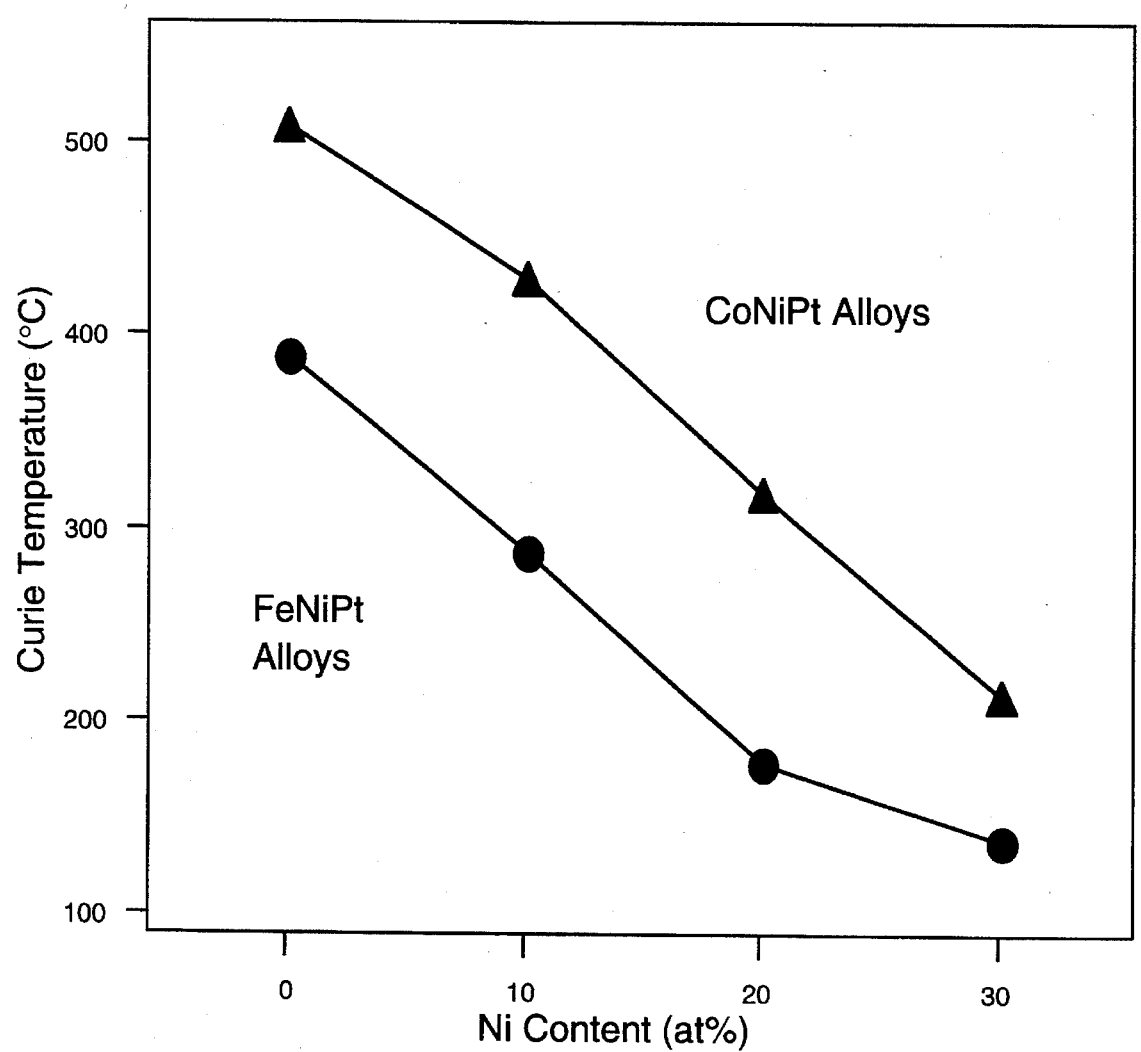
FIG. 12 is a graph of the Curie temperature versus Ni content for the Ni-based films.

FIG. 12 is a graph of the Curie temperature versus Ni content for the Ni-based films. Evidently, this value decreases significantly and approximately linearly with the addition of Ni. In this manner the Curie temperature can be adjusted for particular magneto-optic applications.

Figures 13A, 13B, 13C:
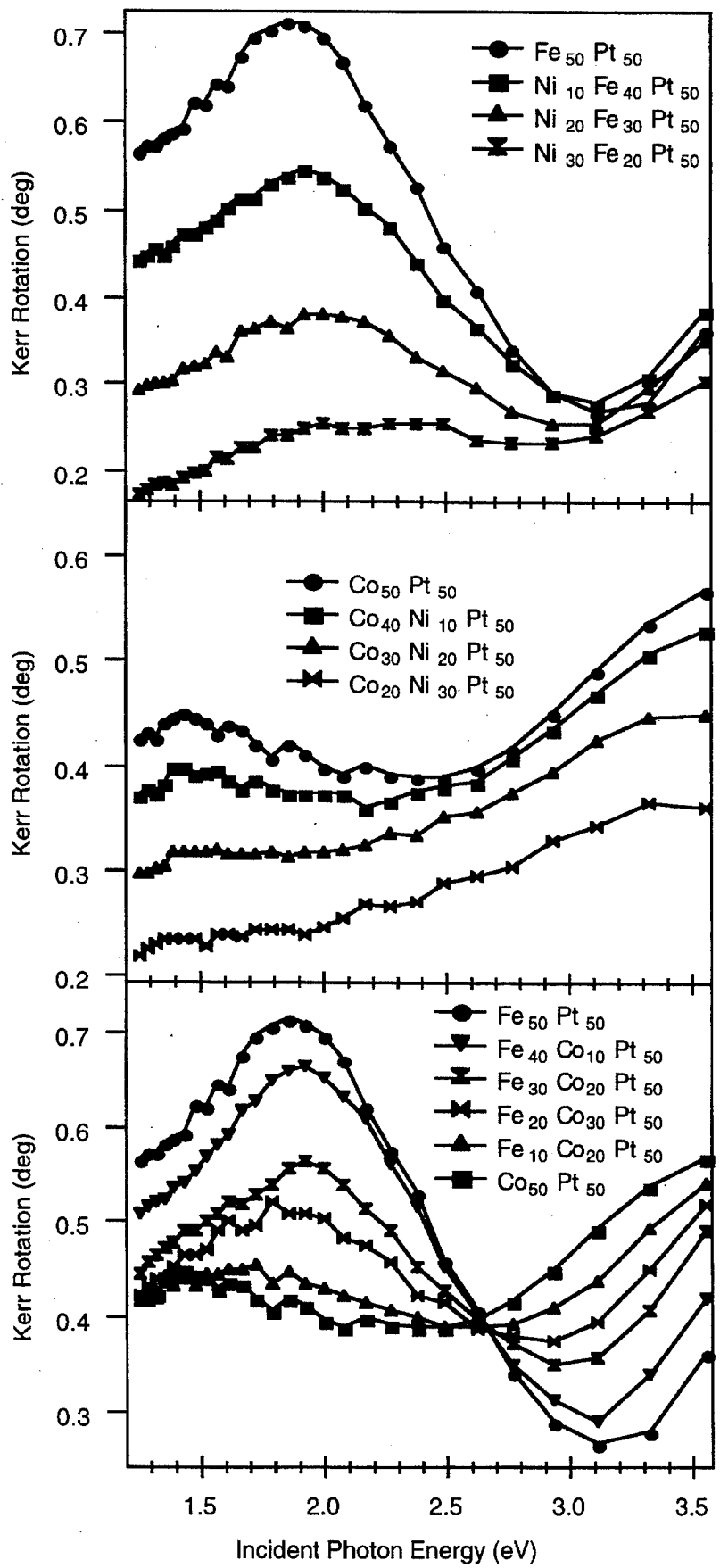
FIGS. 13A, 13B and 13C are graphs is a set of graphs of the Kerr rotation spectra for a number of ternary films.

Finally, FIGS. 13A, 13B and 13C illustrate the Kerr rotation spectra for a number of ternary films according to the invention and the prior art $Co_{50}Pt_{50}$ binary film. The rotation is graphed as a function of incident photon energy. The addition of Ni decreases the rotation, which, however, remains completely sufficient for most alloys.

SUMMARY, RAMIFICATIONS, AND SCOPE

The above examples serve merely to illustrate the invention and are by no means limiting to its scope. The method can employ any deposition processes capable of co-depositing three metals simultaneously. For example, molecular beam epitaxy can be successfully adapted to the method. Furthermore, many other combinations of seed and pre-seed layers are possible. These can have various thicknesses and compositions.

Therefore, the scope of the invention should be determined, not by examples given, but by the appended claims and their legal equivalents.

We claim:

1. A method for making oriented thin films of a ternary intermetallic compound having a tetragonal structure and generally uniaxial magnetic, optical, electronic, and mechanical properties, said method comprising the steps of:

a) selecting a substrate material having an alignment suitable for biasing the orientation of said ternary intermetallic compound and exhibiting no chemical reactiveness to said ternary intermetallic compound;

b) heating said substrate material to a temperature above 450° C.;

c) depositing simultaneously a first metal, a second metal, and a third metal on said substrate material to directly produce said thin film of said ternary intermetallic compound, whereby said thin film adopts the $L1_0$ crystal structure.

2. The method of claim 1, wherein said depositing is performed by co-sputtering of said first metal, said second metal, and said third metal.

3. The method of claim 2, wherein said co-sputtering uses atoms at a pressure between 3 mTorr and 10 mTorr.

4. The method of claim 1, wherein said depositing is performed by simultaneous molecular beam epitaxy of said first metal, said second metal, and said third metal.

5. The method of claim 1, wherein said first metal and said second metal are selected from pairs of metals consisting of CoNi, CoFe, FeNi, and said third metal is selected from the group of metals consisting of Pd and Pt.

6. The method of claim 5, wherein the relative amount of said third metal with respect to said pair of metals is chosen between 40 at. % and 60 at. %.

7. The method of claim 6, wherein the relative amount of said third metal with respect to said pair of metals is 50 at. %.

8. The method of claim 7, wherein the relative amounts of said first metal and said second metal in said pairs of metals is determined in at. % according to the formula $Co_xNi_{50-x}$, $Fe_xNi_{50-x}$, and $Fe_xCo_{50-x}$ for $0<x \leq 50$.

9. The method of claim 6, wherein the relative amounts of said first metal and said second metal in said pairs of metals is determined in at. % according to the formulas $Co_xNi_{50-x}$ for $0<x \leq 30$, $Fe_xNi_{50-x}$ for $0<x \leq 30$, and $Fe_xCo_{50-x}$ for $0<x \leq 50$.

10. The method of claim 6, wherein the relative amount of said third metal with respect to said pair of metals is determined in at. % according to the formulas $(CoNi)_{100-m}Pt_m$, $(FeNi)_{100-m}Pt_m$, $(FeCo)_{100-m}Pt_m$, $(CoNi)_{100-m}Pd_m$, $(FeNi)_{100-m}Pd_m$, $(FeCo)_{100-m}Pd_m$.

11. The thin film produced according to the method of claim 6.

12. The method of claim 1, wherein said substrate material is a single crystal whose [001] lattice parameter is substantially equal to the a-axis of said ternary intermetallic compound and at most 0.4 Angstroms larger than the a-axis.

13. The method of claim 12, wherein the [001] lattice parameter of said single crystal is approximately equal to an integer multiple of the a-axis of said ternary intermetallic compound.

14. The method of claim 12, wherein the [001] lattice parameter of said single crystal is approximately equal to $\sqrt{2}$ times the A-axis of said ternary intermetallic compound.

15. The method of claim 12, wherein said single crystal is selected from the group of materials including MgO and $Al_2O_3$.

16. The method of claim 15, wherein said MgO substrate has an orientation selected from the values including [001] and [110].

17. The method of claim 15, wherein said $Al_2O_3$ substrate has an orientation value [0001].

18. The thin film produced according to the method of claim 15.

19. The method of claim 1, wherein said substrate material is an amorphous material.

20. The method of claim 19, wherein said amorphous material is selected from the group of materials consisting of pure $SiO_2$, amorphous carbon, and glass.

21. The method of claim 1 further comprising the step of depositing a pre-seed layer of Fe on said substrate material before performing said depositing step.

22. The method of claim 21 further comprising the step of depositing a seed layer selected from the group of materials consisting of Fe, Pt, Pd, Cr on said pre-seed layer before performing said depositing step.

23. The method of claim 21, wherein said pre-seed layer has a thickness of approximately 5 Angstroms.

24. The method of claim 1 further comprising the step of depositing a seed layer selected from the group of materials consisting of Fe, Pt, Pd, Cr on said substrate before performing said depositing step.

25. The method of claim 24, wherein said seed layer has a thickness of approximately 50 Angstroms.

* * * * *